(12) United States Patent
Zheng et al.

(10) Patent No.: US 11,018,273 B2
(45) Date of Patent: May 25, 2021

(54) PHOTOSENSITIVE REFLECTOR, LASER INDUCED TOUCH DEVICE AND LASER TOUCH DETECTION METHOD

(71) Applicants: BEIJING BOE DISPLAY TECHNOLOGY CO., LTD., Beijing (CN); BOE TECHNOLOGY GROUP CO., LTD., Beijing (CN)

(72) Inventors: Xiaoyi Zheng, Beijing (CN); Minghui Zhang, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/811,815

(22) Filed: Mar. 6, 2020

(65) Prior Publication Data

US 2020/0212232 A1    Jul. 2, 2020

Related U.S. Application Data

(63) Continuation of application No. 15/248,273, filed on Aug. 26, 2016, now abandoned.

(30) Foreign Application Priority Data

Feb. 19, 2016    (CN) .......................... 201610095218.9

(51) Int. Cl.
*H01L 31/0232* (2014.01)
*G06F 3/041* (2006.01)
(Continued)

(52) U.S. Cl.
CPC ...... *H01L 31/02327* (2013.01); *G02B 5/0808* (2013.01); *G06F 3/0416* (2013.01); *G06F 3/0428* (2013.01); *H01L 31/0203* (2013.01)

(58) Field of Classification Search
None
See application file for complete search history.

(56) References Cited

U.S. PATENT DOCUMENTS

| 2011/0146055 | A1 | 6/2011 | Shibayama |
| 2011/0254809 | A1* | 10/2011 | Yu .......................... G06F 3/0421 345/175 |

(Continued)

FOREIGN PATENT DOCUMENTS

| CN | 102253444 A | 11/2011 |
| CN | 101970995 A | 2/2012 |

(Continued)

OTHER PUBLICATIONS

The First Chinese Office Action dated Feb. 14, 2018; Appl. No. 201610095218.9.

*Primary Examiner* — Amare Mengistu
*Assistant Examiner* — Sarvesh J Nadkarni (57) ABSTRACT

A photosensitive reflector, a laser induced touch device and a laser touch detection method are provided. The photosensitive reflector, comprising a reflection layer and a photosensitive element, wherein the photosensitive element is disposed on or in the reflection layer and configured to sense at least one of light running through the reflection layer, light incident on the reflection layer, or light reflected by the reflection layer.

20 Claims, 4 Drawing Sheets

(51) Int. Cl.
    *G02B 5/08*     (2006.01)
    *G06F 3/042*     (2006.01)
    *H01L 31/0203*     (2014.01)

(56) References Cited

U.S. PATENT DOCUMENTS

| | | | |
|---|---|---|---|
| 2012/0146954 A1* | 6/2012 | Park | G06F 3/0421 |
| | | | 345/175 |
| 2012/0169666 A1* | 7/2012 | Fan | G06F 3/0421 |
| | | | 345/175 |
| 2013/0119237 A1* | 5/2013 | Raguin | H01L 27/14601 |
| | | | 250/208.1 |
| 2016/0041692 A1* | 2/2016 | Lin | G06F 3/0421 |
| | | | 345/175 |
| 2016/0246447 A1* | 8/2016 | Wang | G06F 3/0421 |

FOREIGN PATENT DOCUMENTS

| | | |
|---|---|---|
| CN | 103699275 A | 4/2014 |
| CN | 104156123 A | 11/2014 |

* cited by examiner

Forming one laser transmitter and a plurality of photosensitive reflectors at the edge of a touch area Switching on the laser transmitter to emit laser beams, and forming a laser net extended along one direction in the touch area by the laser beams Emitted by the laser transmitter and reflected by the photosensitive reflectors Connecting photosensitive elements of the photosensitive reflectors to be respectively connected with a control unit, and allowing the photosensitive elements to transmit sensed light receiving information of the laser beams to the control unit Performing touch operation on the touch area and stopping the propagation of the laser beams Allowing the photosensitive elements on an optical path of the laser beams, behind the touch position of the touch operation, to respectively stop receiving the light receiving information Determining the touch position by the control unit according to a predetermined position of the photosensitive reflector which firstly stops receiving the light receiving information

FIG. 6

Forming one visible laser in the horizontal and vertical directions of a rectangular display, respectively, and forming a plurality of photosensitive reflectors at the edge of the rectangular display Switching on the laser transmitters to emit laser beams, and forming a laser net extended along the horizontal and vertical directions in the touch area by the laser beams emitted by the laser transmitters and reflected by the photosensitive reflectors Connecting photosensitive elements of the photosensitive reflectors to be respectively connected with a control unit, and allowing the photosensitive elements to transmit sensed light receiving information of the laser beams to the control unit Performing touch operation on the touch area and stopping the propagation of the laser beams Allowing the photosensitive elements on the optical path of the laser beams in the horizontal and vertical directions, behind the touch position of the touch operation, to respectively stop receiving the light receiving information Determining the touch position by the control unit according to the predetermined position of the respective photosensitive reflectors which firstly stop receiving the light receiving information in the horizontal and vertical directions

FIG. 7

PHOTOSENSITIVE REFLECTOR, LASER INDUCED TOUCH DEVICE AND LASER TOUCH DETECTION METHOD

TECHNICAL FIELD

The present invention relates to a photosensitive reflector, a laser induced touch device and a laser touch detection method.

BACKGROUND

With the rapid development of display technology, touch panels make people's lives more convenient. The touch panels may be divided into resistive type, capacitive type, sonic type, infrared type, optical type and the like according to the induction principle. Wherein, infrared touch panels are widely applied due to the advantages of being not interfered by current, voltage and static electricity and being suitable for hostile environment conditions.

The conventional infrared touch device is to detect and position user touch via an infrared matrix distributed in the X and Y directions. The structure of the infrared touch device is mostly applied in infrared touch panels. The infrared touch panel comprises a display device, a plurality of infrared emitters distributed on any two adjacent sides of the display device, and infrared receivers which are distributed on the other two sides of the display device and are in one-to-one correspondence with the infrared emitters, so that an intersected infrared matrix can be formed. When the display device is touched by a user, two horizontal and vertical red lines running through the touch position will be shielded by a finger, so that the position of a touch point on the display device can be determined.

The conventional infrared touch device generally adopts the specific structure that a plurality of infrared emitters and infrared receivers are distributed on four sides. Each infrared emitter corresponds to one infrared receiver. In order to obtain high resolution, the number of the infrared emitters and the number of the infrared receivers must be simultaneously increased, so that the overall volume of the infrared touch device can be increased. Thus, the conventional infrared touch device is defined by the number of the infrared emitters and the infrared receivers, so that the resolution of the infrared touch device can be limited; the production cost can be improved; and the application in small-size devices can be limited.

SUMMARY

A embodiment of the disclosure provides a photosensitive reflector, comprising a reflection layer and a photosensitive element, wherein the photosensitive element is disposed on or in the reflection layer and configured to sense at least one of light running through the reflection layer, light incident on the reflection layer, or light reflected by the reflection layer.

In some examples, the reflection layer includes an optical glass sheet, one or more films are formed on a light incident surface of the optical glass sheet, and the photosensitive element is disposed on one side of the optical glass sheet opposite to the light incident surface.

In some examples, the reflection layer includes an optical glass sheet, a metal layer is formed on one side of the optical glass sheet opposite to a light incident surface, and the photosensitive element is disposed in an opening of the metal layer.

In some examples, the metal layer is made of silver or aluminum.

In some examples, the photosensitive element is at least one selected from the group consisting of photoresistor, photodiode or photistor.

In some examples, an area of the photosensitive elements occupies less than one third of an area of the reflection layer in the planar direction of the reflection layer.

In some examples, at least one laser transmitter is disposed at an edge of the touch area, photosensitive reflectors are disposed at the edge of the touch area, laser beams emitted by the laser transmitter are reflected by reflection layers of the photosensitive reflectors, so that a laser net is be formed in the touch area by the laser beams, photosensitive elements of the photosensitive reflectors are respectively connected with a control unit; the photosensitive element is configured to transmit sensed light receiving information of the laser beams to the control unit; and the control unit is configured to determine a touch position according to the light receiving information and a predetermined position of the photosensitive reflectors.

In some examples, the laser transmitter is matched with the photosensitive reflectors, so that the laser net extending along one direction is formed in the touch area by the laser beams.

In some examples, the laser transmitter is matched with the photosensitive reflectors, so that the laser net extending along two or more intersected directions are formed in the touch area by the laser beams.

In some examples, each side of the touch area is provided with one photosensitive reflector, multiple photosensitive elements are respectively disposed on each photosensitive reflector, and each photosensitive element corresponds to each reflection point on the photosensitive reflector.

In some examples, multiple photosensitive reflectors are respectively disposed on each side of the touch area; multiple photosensitive elements are respectively disposed on each photosensitive reflector, and each photosensitive element corresponds to each reflection point on the each photosensitive reflector.

In some examples, each side of the touch area is provided with multiple photosensitive reflectors, one photosensitive element is disposed on each photosensitive reflector, and the photosensitive element corresponds to the reflection point on the each photosensitive reflector.

In some examples, the touch area is a display unit or a space area.

In some examples, the display unit is a rectangular display.

In some examples, the laser transmitter is a visible laser, the visible laser is disposed on one or two adjacent vertexes of the rectangular display and matched with the photosensitive reflectors; and the laser net extending along one or two directions parallel to two adjacent sides of the rectangular display are distributed on the rectangular display.

An embodiment of the disclosure provides a laser touch detection method, comprising: forming at least one laser transmitter and photosensitive reflectors at an edge of a touch area, switching on the laser transmitter to emit laser beams, and forming a laser net in the touch area by the laser beams emitted by the laser transmitter and reflected by the photosensitive reflectors; connecting photosensitive elements of the photosensitive reflectors to a control unit, and allowing the photosensitive elements to transmit sensed light receiving information of the laser beams to the control unit; performing a touch operation on the touch area to stop propagation of the laser beams, and allowing the photosensitive elements on an optical path of the laser beams, behind a touch position of the touch operation, to respectively stop receiving the light receiving information; and determining the touch position by the control unit according to a predetermined position of the photosensitive reflector which firstly stops receiving the light receiving information.

In some examples, the laser transmitter is matched with the photosensitive reflectors, so that the laser net extending along one direction is formed in the touch area by the laser beams.

In some examples, the laser transmitter is matched with the photosensitive reflectors, so that the laser net extending along two or more intersected directions are formed in the touch area by the laser beams.

In some examples, the laser transmitter is matched with the photosensitive reflectors, so that the laser nets extending along two mutually perpendicular directions are formed in the touch area by the laser beams.

In some examples, the light receiving information the photosensitive elements is acquired through the control unit by scanning acquisition method or parallel acquisition method.

BRIEF DESCRIPTION OF THE DRAWINGS

Simple description will be given below to the accompanying drawings of the embodiments to provide a more clear understanding of the technical proposals of the embodiments of the present invention. Obviously, the drawings described below only involve some embodiments of the present invention but are not intended to limit the present invention.

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. Obviously, the preferred embodiments are only partial embodiments of the present invention but not all the embodiments. All the other embodiments obtained by those skilled in the art without creative efforts on the basis of the embodiments of the present invention shall fall within the scope of protection of the present invention.

Figure 1:
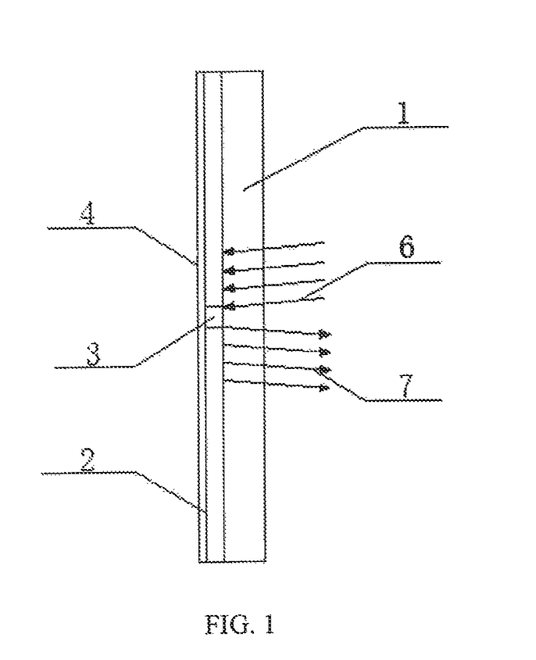
FIG. 1 is a schematic structural view of a photosensitive reflector provided by an embodiment of the present invention.

As illustrated in FIG. 1, the embodiment provides a photosensitive reflector, which comprises a reflection layer and a photosensitive element 3. The photosensitive element 3 is disposed on the reflection layer and configured to sense reflected light 7 or transmitted light (not illustrated in the figure) of the reflection layer. The photosensitive element 3 may be disposed on an incident side or a backlight side of incident light 6 of the reflection layer or embedded into the reflection layer. The position of the photosensitive element may be specifically varied according to the principle of different reflection layers, so that the photosensitive reflector can sense optical signals when ensuring good reflectivity simultaneously.

In the embodiment, the reflection layer includes optical glass 1 for transmitting light. A metal layer 2 with reflection function is disposed on a backlight surface of the optical glass 1. The structure forms a total reflector. Preferably, the metal layer 2 is made from silver or aluminum with good reflecting property, so that the light loss in the reflecting process can be reduced and the light intensity after reflection for a plurality of times can be guaranteed, and hence the light sensing accuracy of the photosensitive element 3 can be guaranteed. In addition, the reflection layer may also be made from other materials with good reflecting property. The photosensitive element 3 is disposed at a position for receiving light in the metal layer 2 of the total reflector. The light sensing principle of the photosensitive element is that the photosensitive element 3 is configured to sense light reflected by the reflection layer. As the size of the photosensitive element 3 is set to be enough small relative to the diameter of luminous spots in the embodiment, the light reflection cannot be affected, so that light sensing can be achieved on the basis of reflection.

In the example as illustrated in FIG. 1, the photosensitive element is disposed on an opposite side of an incident surface of the optical glass 1. However, the photosensitive element may also be disposed on the incident surface of the optical glass. At this point, the photosensitive element 3 may receive light directly incident to the reflection layer and/or light reflected by the reflection layer (e.g., light reflected by the metal layer 2). In this case, the optical glass 1 and the metal layer 2 may also be replaced by an opaque reflection layer.

In addition, the area of the photosensitive element may be less than one third of the area of the reflection layer in the planar direction of the reflection layer, so that the photosensitive element cannot obviously affect the light reflection of the metal layer. However, the area ratio is not limited to be less than one third and may be less than one fourth, less than one fifth, less than one tenth or the like, as long as the required conditions of reflected light and sensed light can be satisfied.

For instance, the photosensitive element 3 disposed in the metal layer 2, for instance, is disposed in an opening of the metal layer 2, and hence can receive light running through the optical glass 1.

In some examples, the photosensitive element 3 is a photoresistor, a photodiode or a photistor and hence can have good light sensing function. But the photosensitive element 3 is not limited thereto and may also be other elements capable of sensing light and converting the light into other signals.

In addition, an overcoat (OC) layer 4 may also be disposed on the outside of the metal layer 2 to protect the reflection layer and the photosensitive element 3.

Figure 2:
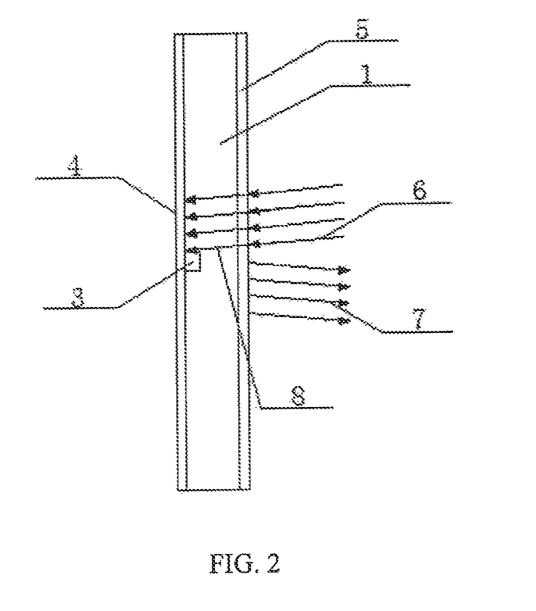
FIG. 2 is a schematic structural view of a photosensitive reflector provided by an embodiment of the present invention.

As illustrated in FIG. 2, an embodiment provides a photosensitive reflector. The photosensitive reflector has the same principle and similar structure with that of the photosensitive reflector illustrated in FIG. 1. The differences are only that: the reflection layer includes optical glass 1 for transmitting light; one or more films 5 are disposed on an incident surface of the optical glass 1; the films 5 may be configured to reflect partial light and transmit partial light; the structure forms a transflective reflector, and a photosensitive element 3 is disposed on a backlight surface of the optical glass 1 and configured to receive transmitted light 8 of the reflection layer. In addition, the photosensitive element 3 may also be embedded into the optical glass 1 and can still receive the transmitted light 8 of the reflection layer, as long as the structure does not affect the reflection function of the reflector.

Figure 3:
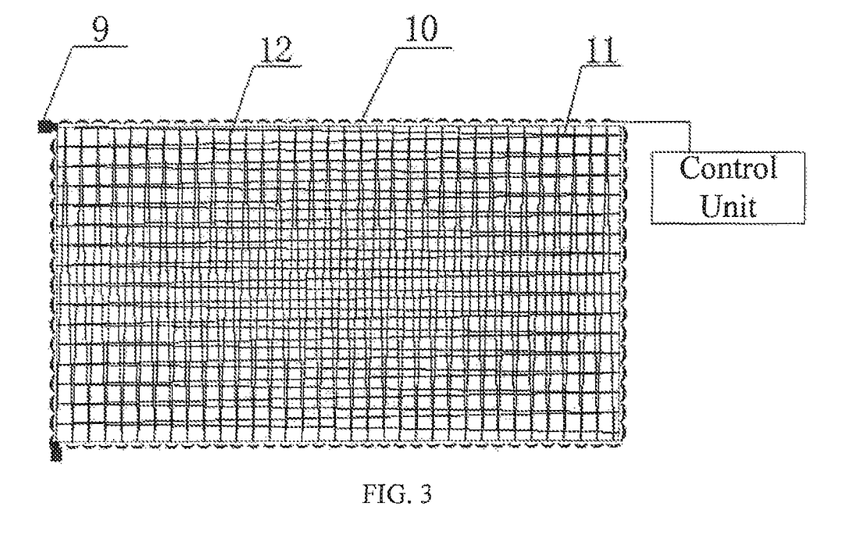
FIG. 3 is a schematic structural view of a laser induced touch device provided by an embodiment of the present invention.

An embodiment provides a laser induced touch device, which comprises a touch area. At least one laser transmitter 9 is disposed at the edge of the touch area, and photosensitive reflectors 10 are disposed at the edge of the touch area. By utilization of the reflection principle, laser beams emitted by the laser transmitter 9 are reflected by reflection layers of the photosensitive reflectors 10, so that laser nets are formed in the touch area by the laser beams and reflected beams. Therefore, the embodiment can improve the touch resolution when adopting less laser transmitters 9 simultaneously, and can reduce the size of the touch area when ensuring high resolution simultaneously. The touch area may be any geometrical display unit or any space-shaped space area. The laser transmitter 9 may be arranged at the center or an endpoint of one side of the touch area. The number of the laser transmitters 9 on each side may be one or more, as long as the structural form of the laser nets can be formed in the touch area by the laser beams and the reflected beams.

The laser nets in the embodiment may be that: the laser transmitters 9 are matched with the photosensitive reflectors 10, so that laser nets extending along two intersected directions can be formed in the touch area by the laser beams and the reflected beams.

Multiple photosensitive reflectors 10 are respectively disposed on each side of the touch area. One photosensitive element 3 is respectively disposed on each photosensitive reflector 10. Each photosensitive element 3 corresponds to reflection points on each photosensitive reflector 10. The photosensitive elements 3 of the photosensitive reflectors 10 are respectively connected with a control unit. The photosensitive element 3 is configured to transmit sensed light receiving information of the laser beams to the control unit. The control unit is configured to determine the touch position according to the light receiving information and the predetermined position of the photosensitive reflector 10.

For instance, as for the control unit, when software may be utilized for implementation, in view of the level of the conventional hardware process, a module implemented by software may be adopted. Regardless of the cost, corresponding hardware circuit may be established by those skilled in the art to achieve corresponding function. The hardware circuit includes a general very large scale integration (VLSI) circuit or a gate array and the conventional semiconductors such as logic chips and transistors or other discrete elements. The module may also be achieved by a programmable hardware device such as a field programmable gate arrays, a programmable array logic and a programmable logic device.

The touch area and the control unit are separately illustrated in FIG. 3. But the embodiment is not limited thereto. For instance, the control unit may be integrated in other components of the touch area, e.g., integrated in a display unit of the touch area.

Taking the case that the display unit is a rectangular display as illustrated in FIG. 3 as an example, one structural form of the laser induced touch device is as follows: due to high brightness of visible laser, the loss of light energy during reflection is small and the collimation property is good. Moreover, accurate light propagation path can be guaranteed, and the touch effect cannot be affected. Therefore, the laser transmitters 9 may adopt visible lasers which are disposed on two adjacent vertexes of the rectangular display. A plurality of photosensitive reflectors 10 are respectively distributed on each side of the rectangular display, namely one photosensitive reflector 10 is respectively disposed at each reflection point. The visible lasers are matched with the photosensitive reflectors 10, so that laser nets extending along the horizontal and vertical directions are distributed on the rectangular display. That is to say, when point control of the rectangular display must be achieved, a visible laser must be respectively disposed on two adjacent vertexes, and photosensitive reflectors 10 must be respectively disposed on four sides of the rectangular display, so that laser nets 11 and 12 respectively extending along the horizontal and vertical directions can be distributed on the rectangular display by laser beams and reflected beams. The laser nets can sense the point-control touch operation of an operator. Accurate touch operation and positioning can be achieved only by utilization of two visible lasers and a plurality of photosensitive reflectors 10, so that the production cost can be greatly reduced.

When the display unit is the rectangular display, apart from the above structure, when point control must be achieved, one or more visible lasers may be respectively disposed on two adjacent sides or four adjacent sides, and photosensitive reflectors 10 may be respectively disposed on four sides, so that laser nets 11 and 12 respectively extending along the horizontal and vertical directions can be distributed on the rectangular display by laser beams and reflected beams.

In addition, other structures apart from the rectangular display, e.g., circular displays, elliptical displays, polygonal displays and displays in other shapes or space areas in any shape which are only required to achieve point control on a plane, may all adopt the above structure to achieve point touch, as long as the laser transmitters 9 are matched with the reflectors and the laser nets respectively extending along two intersected directions are formed in the plane. The point-control touch operation can be achieved when the included angle of the laser nets extending along the two intersected directions is any angle.

An embodiment provides a laser induced touch device. The laser induced touch device has the same principle and the similar structure with the laser induced touch device illustrated in FIG. 3. The difference is only that: the laser transmitter 9 is matched with the photosensitive reflectors 10, so that a laser net extending along one direction is formed in the touch area by laser beams and reflected beams, and the positioning of the touch area in one direction can be achieved. Thus, the usage amount of the laser transmitters 9 and the photosensitive reflectors 10 in a small-size touch area can be reduced, and hence the production cost can be reduced.

Figure 4:
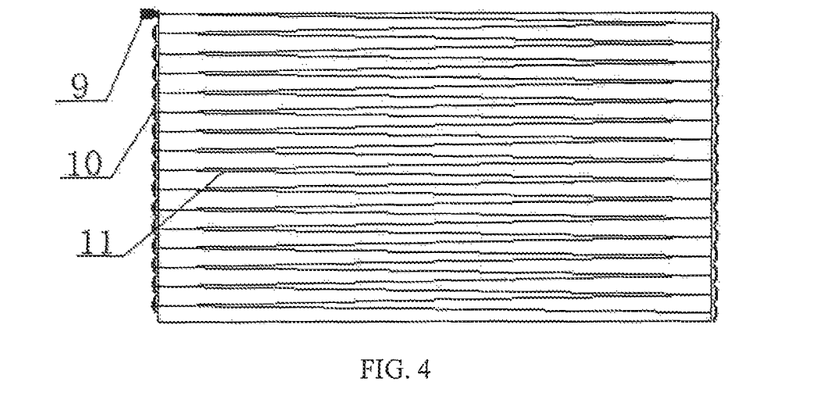
FIG. 4 is a schematic structural view of a laser induced touch device provided by an embodiment of the present invention.

Taking the case that the display unit is a rectangular display as illustrated in FIG. 4 as an example, the laser transmitter 9 is a visible laser which is disposed on one vertex of the rectangular display; the photosensitive reflectors 10 are disposed on two sides corresponding to the visible laser, one photosensitive reflector 10 is respectively disposed on each reflection point on each side; and the visible laser is matched with the photosensitive reflectors 10, so that a laser net extending along the horizontal or vertical direction is distributed on the rectangular display. That is to say, when the touch mode is that the control action can be achieved by only sliding along the vertical direction, a visible laser may be only disposed on one vertex of the rectangular display, and photosensitive reflectors 10 are disposed on two sides in the vertical direction, so that a laser net 11 extending along the vertical direction can be formed by laser beams and reflected beams. The laser net may sense the touch operation of sliding along the vertical direction of an operator.

When the display unit is the rectangular display, apart from the above structure, when the touch mode is that the control action can be achieved by only sliding along the vertical direction, the structure may also be that: one or more visible lasers are respectively disposed on one or two long sides, and photosensitive reflectors 10 are disposed on two sides in the vertical direction, so that a laser net 11 extending along the vertical direction can be formed by laser beams and reflected beams.

In addition, other structures apart from the rectangular display, e.g., circular displays, elliptical displays, polygonal displays and displays in other shapes or space areas in any shape which are only required to achieve point control on a plane, may all adopt the above structure to achieve the touch operation of sliding along one direction, as long as the laser transmitter 9 is matched with the reflectors and the laser net extending along the direction is formed in the plane, and hence the touch operation of sliding along one direction can be achieved.

An embodiment provides a laser induced touch device. The laser induced touch device has the same principle and similar structure with that of the laser induced touch device illustrated in FIGS. 3 and 4. The difference is only that: the laser transmitters 9 are matched with the photosensitive reflectors 10, so that laser nets respectively extending along more than three intersected directions can be formed in the touch area by laser beams and reflected beams. Thus, the synchronous positioning of the touch area in more than three intersected directions can be achieved, and hence the positioning accuracy can be improved.

Figure 5:
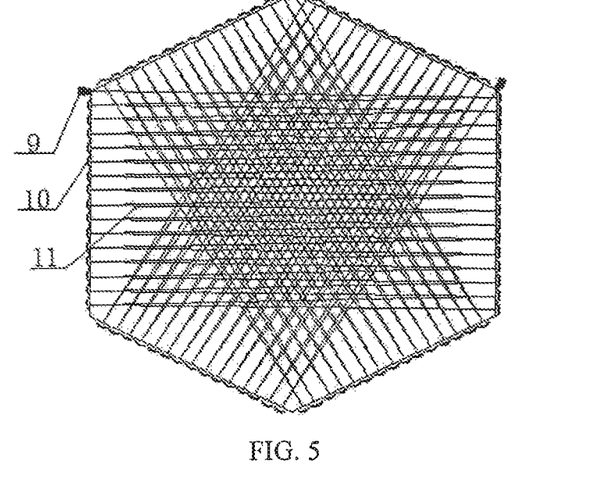
FIG. 5 is a schematic structural view of a laser induced touch device provided by an embodiment of the present invention.

As illustrated in FIG. 5, taking the case that the display unit is a hexagonal display as an example, one structural form of the laser induced touch device is as follows: the laser transmitters 9 are visible lasers which are respectively disposed on three adjacent vertexes of the hexagonal display; a plurality of photosensitive reflectors 10 are respectively distributed on each side of the hexagonal display, namely one photosensitive reflector 10 is respectively disposed at each reflection point; and the visible lasers are matched with the photosensitive reflectors 10, so that intersected laser nets respectively extending along the same directions of three adjacent sides are respectively formed on the hexagonal display. That is to say, when more accurate point control of the hexagonal display must be achieved, a visible laser must be respectively disposed on three adjacent vertexes, and photosensitive reflectors 10 must be respectively disposed on six sides of the hexagonal display, so that laser nets extending along the same directions of three adjacent sides of the hexagonal display can be distributed on the hexagonal display by laser beams and reflected beams. The laser nets can sense the point-control touch operation of the operator.

When the display unit is the hexagonal display, apart from the above structure, when point control must be achieved, one or more visible lasers may be respectively disposed on three adjacent sides or six adjacent sides, and photosensitive reflectors 10 may be respectively disposed on six sides, so that the intersected laser nets respectively extending along the same directions of the three adjacent sides can be formed on the hexagonal display by laser beams and reflected beams.

In addition, when more accurate touch operation must be achieved, other structures apart from the hexagonal display, e.g., circular displays, triangular displays and displays in other shapes or space areas in any shape which must achieve point control on three-dimensional (3D) space, may all adopt the above structure to achieve point touch, as long as the laser transmitters 9 are matched with the photosensitive reflectors, so that the laser nets respectively extending along the three intersected directions can be formed in the plane or the space. The point-control touch operation can be achieved when the included angle between the laser nets extending along the three intersected directions is any angle.

In summary, structures such as octagonal displays and decagonal displays may also adopt intersected laser nets extending along more directions to achieve precise touch operation.

In some examples of the laser induced touch device provided by the embodiments of the disclosure, a plurality of photosensitive reflectors 10 are respectively disposed on each side of the touch area; a plurality of photosensitive elements 3 are respectively disposed on each photosensitive reflector 10; and each photosensitive element 3 respectively corresponds to each reflection point on the photosensitive reflector 10. Therefore, the production cost of the laser induced touch device can be reduced, and the requirement of light reflection can be satisfied.

In some examples of the laser induced touch device provided by the embodiments of the disclosure, one photosensitive reflector 10 is respectively disposed on each side of the touch area; a plurality of photosensitive elements 3 are respectively disposed on each photosensitive reflector 10; and each photosensitive element 3 respectively corresponds to each reflection point on the photosensitive reflector 10. Therefore, the production cost of the laser induced touch device can be reduced, and the requirement of light reflection can be satisfied.

Figure 6:
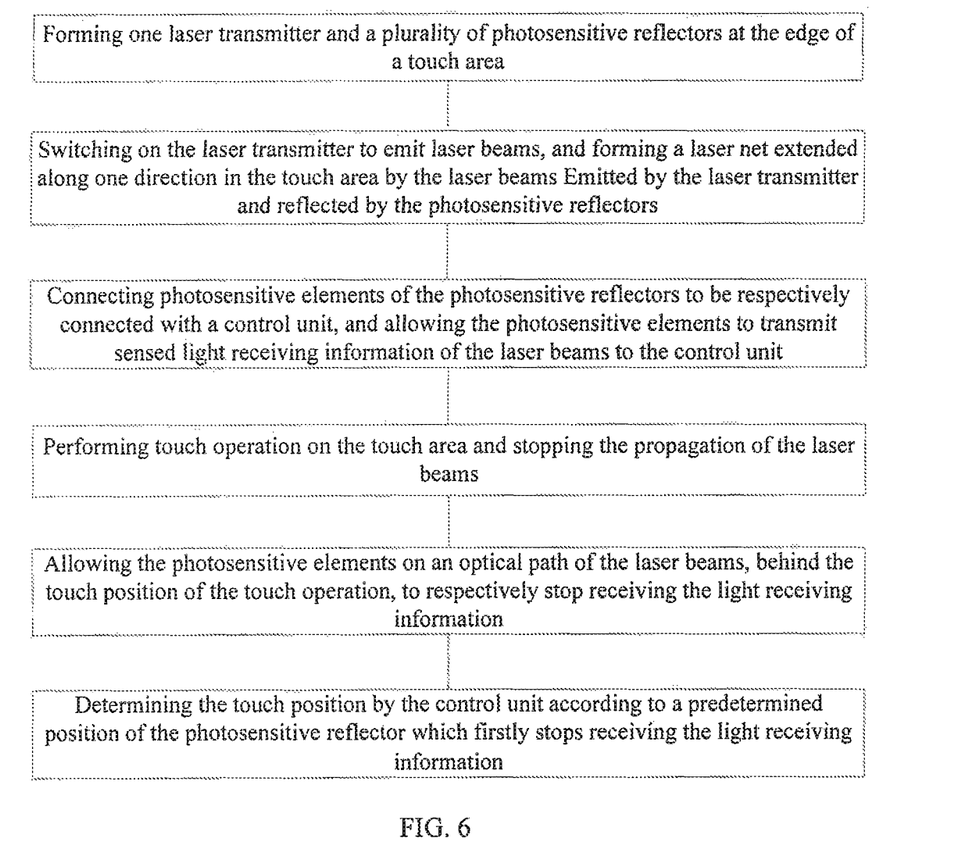
FIG. 6 is a flowchart of a laser touch detection method provided by an embodiment of the present invention.

An embodiment provides a laser touch detection method, which, as illustrated in FIG. 6, comprises the following steps:

S1: forming at least one laser transmitter 9 and photosensitive reflectors 10 at the edge of a touch area, switching on the laser transmitter 9 to emit laser beams, and forming laser nets in the touch area by the laser beams and reflected beams formed by the reflection of the laser beams via the photosensitive reflectors 10. In the embodiment, the laser transmitter 9 is matched with the photosensitive reflectors 10, so that a laser net extending along one direction is formed in the touch area by the laser beams and the reflected beams, and hence the touch operation of sliding control along the direction can be achieved.

S2: allowing photosensitive elements 3 of the photosensitive reflectors 10 to be respectively connected with a control unit, and allowing the photosensitive elements 3 to transmit sensed light receiving information of the laser beams to the control unit.

S3: performing touch operation on the touch area, stopping the propagation of the laser beams, and allowing the photosensitive elements 3 on an optical path of the laser beams, behind the touch position of the touch operation, to respectively stop receiving the light receiving information.

S4: allowing the control unit to determine the specific touch position according to the predetermined position of the photosensitive reflector 10 which firstly stops receiving the light receiving information. The method of acquiring the light receiving information of the photosensitive elements 3 via the control unit is scanning acquisition method or parallel acquisition method. Therefore, the acquisition efficiency can be effectively improved and the delay and errors can be reduced.

In some examples of the laser touch detection method provided in the embodiments of the disclosure, the laser transmitters 9 are matched with the photosensitive reflectors 10, so that laser nets respectively extending along two intersected directions can be formed in the touch area by laser beams and reflected beams. For instance, the laser transmitters 9 are matched with the photosensitive reflectors 10, so that laser nets respectively extending along the horizontal and vertical directions can be formed in the touch area by laser beams and reflected beams.

Figure 7:
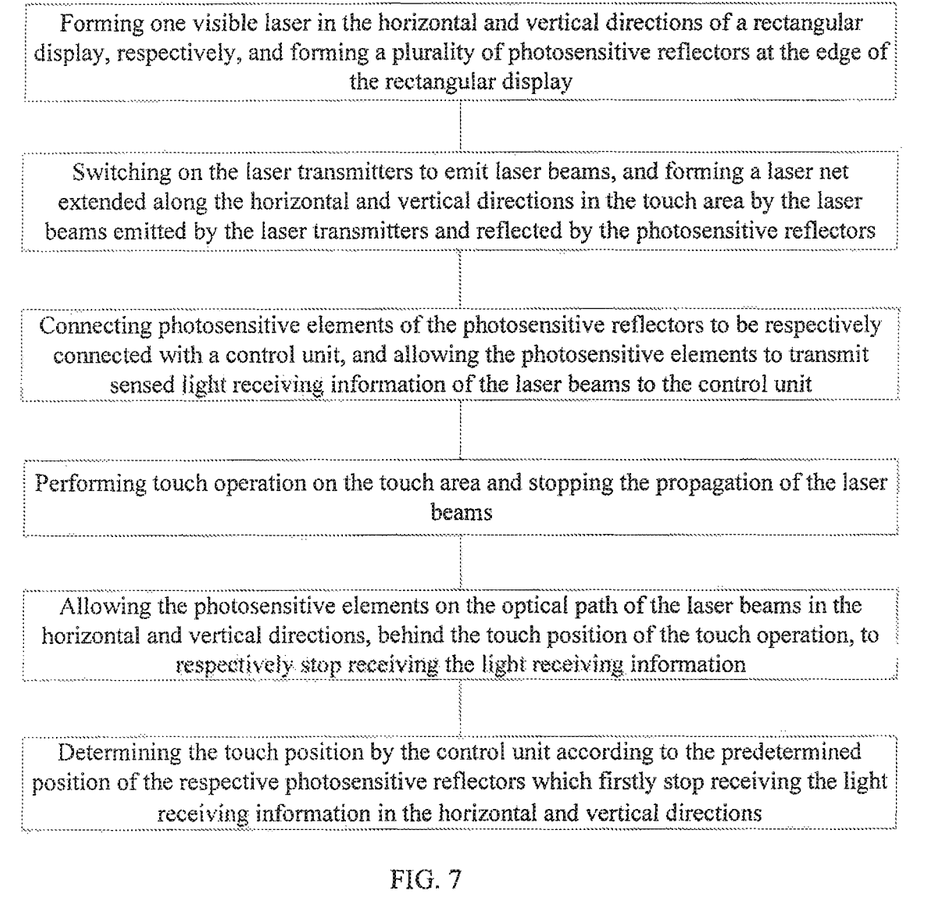
FIG. 7 is a flowchart of a laser touch detection method provided by an embodiment of the present invention.

Taking the rectangular display as illustrated in FIG. 3 as an example, as illustrated in FIG. 7, the method specifically comprises the following steps:

S1': respectively forming a visible laser in the horizontal and vertical directions of the rectangular display to emit laser beams. In order to form laser nets 11 and 12 respectively extending along the horizontal and vertical directions in the touch area only via the two visible lasers, light of initial outgoing laser beams of the visible lasers must have specific inclination (for the convenience of viewing, the angle as illustrated in FIG. 3 is 1°, and the angle may be further reduced if the resolution must be increased). The laser beams are reflected by the photosensitive reflectors 10 when arriving at one end of the rectangular display. In the embodiment, as a plurality of photosensitive reflectors 10 are respectively disposed in the horizontal and vertical directions, the light can be reflected and propagated back and forth in the rectangular display to form the laser nets respectively extending along the horizontal and vertical directions. As the initial angle of the lasers is determined, the number and the position of the photosensitive reflectors 10 are also determined, and hence the laser nets are also determined.

S2': allowing photosensitive elements 3 of the photosensitive reflectors 10 to be respectively connected with a control unit, and allowing the photosensitive elements 3 to transmit sensed light receiving information of the laser beams to the control unit.

S3': stopping the propagation path of the laser beams in the case of finger touch, so that one first photosensitive reflector 10 which cannot receive light is respectively disposed in the horizontal and vertical directions.

S4': allowing the control unit to determine the specific touch position according to the predetermined position of the respective photosensitive reflectors 10 which firstly stop receiving the light receiving information in the horizontal and vertical directions, and calculating the specific position of the finger according to the path of the laser net.

The embodiment utilizes the reflection principle, improves the touch resolution when adopting less laser transmitters 9 simultaneously, and reduces the size of the touch area when ensuring high resolution simultaneously.

In some examples of the laser touch detection method provided in the embodiments of the disclosure, the laser transmitters 9 are matched with the photosensitive reflectors 10, so that laser nets respectively extending along three or more intersected directions can be formed in the touch area by laser beams and reflected beams.

In summary, the present invention provides a photosensitive reflector, a laser induced touch device and a laser touch detection method, which can improve the resolution of the touch device when adopting less infrared emitters simultaneously, can achieve accurate touch operation, and can be flexibly applied in various laser induced control situations such as laser detection and laser touch display.

The foregoing is only the preferred embodiments of the present invention and not intended to limit the scope of protection of the present invention. The scope of protection of the present invention should be defined by the appended claims.

The application claims priority to the Chinese patent application No. 201610095218.9, filed Feb. 19, 2016, the disclosure of which is incorporated herein by reference as part of the application.

The invention claimed is:

1. A laser induced touch device, comprising:
a touch area;
at least one laser transmitter disposed at an edge of the touch area; and
photosensitive reflectors disposed at the edge of the touch area, wherein each of the photosensitive reflectors comprises a reflection layer and a photosensitive element, wherein the photosensitive element is disposed on or in the reflection layer and configured to sense at least one of light running through the reflection layer, light incident on the reflection layer, or light reflected by the reflection layer,
wherein laser beams emitted by the laser transmitter are reflected by reflection layers of the photosensitive reflectors, so that a laser net is formed in the touch area by the laser beam, and
wherein the touch area has two opposite edges, the photosensitive reflectors disposed at the edge of the touch area comprise two groups of photosensitive reflectors disposed at the two opposite edges of the touch area, respectively, and one laser beam emitted by one laser transmitter is reflected back and forth by reflection layers of the two groups of the photosensitive reflectors at two opposite edges so as to form a plurality of reflection points at each of the two opposite edges, and the plurality of reflection points are distributed along an extension direction of the edge of the touch area.

2. The laser induced touch device according to claim 1, wherein each of the two groups of photosensitive reflectors is arranged in a first direction, light of an initial outgoing laser beam of the laser beam is inclined with respect to a second direction, and the second direction is perpendicular to the first direction.

3. The laser induced touch device according to claim 2, wherein the light of the initial outgoing laser beam forms an angle with the second direction, and the angle is greater than zero and less than or equal to 1°.

4. The laser induced touch device according to claim 2, wherein reflected laser beams of the laser net between the two opposite edges respectively reflected by the two groups of the photosensitive reflectors come from the initial outgoing laser beam.

5. The laser induced touch device according to claim 1, wherein the laser transmitter is arranged at a center or an endpoint of the edge of the touch area.

6. The laser induced touch device according to claim 1, wherein photosensitive elements of the photosensitive reflectors are respectively connected with a control unit; the photosensitive element is configured to transmit sensed light receiving information of the laser beams to the control unit; and the control unit is configured to determine a touch position according to the light receiving information and a predetermined position of the photosensitive reflectors.

7. The laser induced touch device according to claim 6, wherein the laser transmitter is matched with the photosensitive reflectors, so that the laser net extending along one direction is formed in the touch area by the laser beams.

8. The laser induced touch device according to claim 6, wherein the laser transmitter is matched with the photosensitive reflectors, so that the laser net extending along two or more intersected directions are formed in the touch area by the laser beams.

9. The laser induced touch device according to claim 6, wherein each side of the touch area is provided with one photosensitive reflector, multiple photosensitive elements are respectively disposed on each photosensitive reflector, and each photosensitive element corresponds to each reflection point on the photosensitive reflector.

10. The laser induced touch device according to claim 6, wherein multiple photosensitive reflectors are respectively disposed on each side of the touch area; multiple photosensitive elements are respectively disposed on each photosensitive reflector, and each photosensitive element corresponds to each reflection point on the each photosensitive reflector.

11. The laser induced touch device according to claim 6, wherein each side of the touch area is provided with multiple photosensitive reflectors, one photosensitive element is disposed on each photosensitive reflector, and the photosensitive element corresponds to the reflection point on the each photosensitive reflector.

12. The laser induced touch device according to claim 1, wherein the display unit is a rectangular display, the laser transmitter is a visible laser, the visible laser is disposed on one or two adjacent vertexes of the rectangular display and matched with the photosensitive reflectors; and the laser net extending along one or two directions parallel to two adjacent sides of the rectangular display are distributed on the rectangular display.

13. The laser induced touch device according to claim 1, wherein the reflection layer includes an optical glass sheet and one or more films, the one or more films are located on the optical glass sheet and configured to reflect partial light and transmit partial light to form a transflective reflector, and
wherein transflective reflector and the photosensitive element are located at two opposite sides of the optical glass sheet, respectively.

14. The laser induced touch device according to claim 1, wherein an area of the photosensitive elements occupies less than one third of an area of the reflection layer in the planar direction of the reflection layer.

15. The laser induced touch device according to claim 1, wherein the plurality of reflection points at one of the two opposite edges are staggered with the plurality of reflection points at the other one of the two opposite edges.

16. The laser induced touch device according to claim 1, wherein photosensitive reflectors disposed at one of the two opposite edges of the touch area are staggered with photosensitive reflectors disposed at the other one of the two opposite edges of the touch area.

17. A laser induced touch device, comprising:
a touch area;
at least one laser transmitter disposed at an edge of the touch area; and
photosensitive reflectors disposed at the edge of the touch area, wherein each of the photosensitive reflectors comprises a reflection layer and a photosensitive element, wherein the photosensitive element is disposed on or in the reflection layer and configured to sense at least one of light running through the reflection layer, light incident on the reflection layer, or light reflected by the reflection layer,
wherein laser beams emitted by the laser transmitter are reflected by reflection layers of the photosensitive reflectors, so that a laser net is formed in the touch area by the laser beam, and
wherein the touch area has two opposite edges, the photosensitive reflectors disposed at the edge of the touch area comprise two groups of photosensitive reflectors disposed at the two opposite edges of the touch area, respectively, and one laser beam emitted by one laser transmitter is reflected back and forth by reflection layers of the two groups of the photosensitive reflectors at two opposite edges, and
wherein the at least one laser transmitter comprises three laser transmitters, the laser induced touch device has three adjacent vertexes, and the three laser transmitters are disposed on the three adjacent vertexes, respectively, to form three vertexes of a triangle.

18. A laser touch detection method, comprising:
forming at least one laser transmitter and photosensitive reflectors at an edge of a touch area, switching on the laser transmitter to emit laser beams, and forming a laser net in the touch area by the laser beams emitted by the laser transmitter and reflected by the photosensitive reflectors;
connecting photosensitive elements of the photosensitive reflectors to a control unit, and allowing the photosensitive elements to transmit sensed light receiving information of the laser beams to the control unit;
performing a touch operation on the touch area to stop propagation of the laser beams, and allowing the photosensitive elements on an optical path of the laser beams, behind a touch position of the touch operation, to respectively stop receiving the light receiving information; and
determining the touch position by the control unit according to a predetermined position of the photosensitive reflector which firstly stops receiving the light receiving information,
wherein the touch area has two opposite edges, the photosensitive reflectors disposed at the edge of the touch area comprise two groups of photosensitive reflectors disposed at the two opposite edges of the touch area, respectively, and one laser beam emitted by one laser transmitter is reflected back and forth by reflection layers of the two groups of the photosensitive reflectors at two opposite edges so as to form a plurality of reflection points at each of the two opposite edges, and the plurality of reflection points are distributed along an extension direction of the edge of the touch area.

19. The laser touch detection method according to claim 18, wherein each of the two groups of photosensitive reflectors is arranged in a first direction, light of an initial outgoing laser beam of the laser beam is inclined with respect to a second direction, and the second direction is perpendicular to the first direction.

20. The laser touch detection method according to claim 19, wherein the laser transmitter is matched with the photosensitive reflectors, so that the laser net extending along one direction is formed in the touch area by the laser beams, reflected laser beams of the laser net between the two opposite edges respectively reflected by the two groups of the photosensitive reflectors come from the initial outgoing laser beam.

\* \* \* \* \*